(12) United States Patent
Chien et al.

(10) Patent No.: US 6,917,117 B2
(45) Date of Patent: Jul. 12, 2005

(54) LOWER THE ON-RESISTANCE IN PROTECTION CIRCUIT OF RECHARGEABLE BATTERY BY USING FLIP-CHIP TECHNOLOGY

(75) Inventors: Feng-Tso Chien, Chung-Li (TW); Chii-Wen Chen, Hsinchu (TW); Kou-Way Tu, Hualian (TW); Zheng-Feng Lin, Chung-Ho (TW)

(73) Assignee: Chino-Excel Technologies, Corp., Taipei Hsien (TW)

( * ) Notice: Subject to any disclaimer, the term of this patent is extended or adjusted under 35 U.S.C. 154(b) by 166 days.

(21) Appl. No.: 10/625,855

(22) Filed: Jul. 23, 2003

(65) Prior Publication Data

US 2004/0070081 A1 Apr. 15, 2004

Related U.S. Application Data

(62) Division of application No. 10/013,158, filed on Dec. 10, 2001, now abandoned.

(30) Foreign Application Priority Data

Dec. 11, 2000 (TW) .......................................... 89126353 A

(51) Int. Cl.⁷ .............................................. H01L 23/48
(52) U.S. Cl. ..................................................... 257/778
(58) Field of Search .................................. 257/778, 737, 257/738; 438/108, 126; 320/107

*Primary Examiner*—David A. Zarneke
(74) *Attorney, Agent, or Firm*—Bacon & Thomas, PLLC

(57) ABSTRACT

A method of mounting flip-chip for lowering the on-resistance of power transistor in the protection circuit of rechargeable battery, which comprises a power field effect transistor and a protection IC, has the following steps: first, serially connect drain metal contacts of two transistors to form a chip cell during fabrication of wafer; then, use welding torch to point weld the metal wire on contact of each chip cell, so that the source and gate contacts will form welding metal bumps respectively; cut the wafer to form bare chip cells of two serially connected gate electrodes; stain said chip cell with tin so that said welding metal bumps on contacts are attached with tin balls; apply plastic material to positioned points of printed circuit board; use flip-chip technology to make drain of a bare chip cell face upward, so that said tin balls are aligned with the positioned points of printed circuit board; finally, passing through an oven for heating and pressuring, so that said tin balls will fuse and said plastic material will be hardened and soldered together with contacts on the printed circuit board. Thus, it is possible to omit steps of wire welding and packing for power transistor, not only lower the cost and reduce the volume of the protection circuit but also lower the on-resistance of power field effect transistor.

1 Claim, 3 Drawing Sheets

LOWER THE ON-RESISTANCE IN PROTECTION CIRCUIT OF RECHARGEABLE BATTERY BY USING FLIP-CHIP TECHNOLOGY

This application is a division of Ser. No. 10/013,158 filed Dec. 10, 2001, abandoned.

FIELD OF THE INVENTION

The present invention relates to a method of mounting flip-chip for lowering the on-resistance of power transistor in the protection circuit of rechargeable battery, particularly relates to a protection circuit of rechargeable battery using flip-chip touch welding technology to weld a bare chip directly onto a circuit board without packing. Thus, it is possible to lower the on-resistance of a power transistor because no footed lead connection is needed.

BACKGROUND ART

As shown in FIG. 1 is an example of using rechargeable battery protection circuit in conventional application such as secondary battery of PDA (Personal Data Assistance) and mobile phone, wherein the working principle of the protection IC is as follows: the first pin Cout controls the gate electrode Gate of power field effect transistor MOSFET on the discharge end to enable the charge of said battery pack; the second pin Ct is connected to an external capacitor to control the output delay time of a voltage inspection device; the third pin Vss is grounded; the fourth pin Dout is connected to the gate electrode Gate of power field effect transistor MOSFET on the discharge end so as to control the output current of a battery pack; the fifth pin Vdd is connected to a rechargeable battery end so as to monitor the voltage of said rechargeable battery and provide a power source of said protection circuit; the sixth pin V-monitors the discharge current of said battery pack, there is serially connected a short-circuit protection device to prevent said discharge current from becoming too large. As shown in FIGS. 2a and 2b, above mentioned protection circuit serially connects gate electrodes of two power field effect transistors obtained from standard packing process, wherein said gate electrodes are connected to a protection IC, and the source of one transistor is connected to the negative end of a rechargeable battery while the source of another transistor is connected to the negative end of a power supply. After completion of packing, all power field effect transistors contain a lead frame, which is soldered onto the protection circuit of circuit board.

However, due to the packing structure of the power field effect transistor, its volume is largely increased after welded onto the protection circuit, which not only affects battery volume but also has a much higher resistance in a packed power field effect transistor than that of a bare chip due to the resistance of lead frame itself. Therefore, the inventors have taken the omission of the welding wire and the packing steps of a power field effect transistor into consideration, and found that it is possible to use flip-chip mounting technique to lower not only the volume of a protection circuit but also the on-resistance of said power field effect transistor.

The official gazette of ROC Patent No. 366576 disclosed a "Method of configuring a flip-chip assembled lead frame for an integrated circuit device and a device formed therefrom", which mainly comprises: an integrated circuit device having chip and lead frame; wherein the surface of said chip has a plurality of tin-contained metal bumps that electrically connected to the external, and said lead frame has a plurality of lead feet. The configuration steps will first metallurgy process areas of multiple lead feet carrying chip on said lead frame so that said lead-foot area has a tin-stained feature; align said areas of tin-stained lead feet to said plurality of tin-contained metal bumps on the chip, respectively; finally through heating and pressuring to fix said areas of tin-stained lead feet on said lead frame to said plurality of tin-contained metal bumps on the chip. However, above-mentioned flip-chip configuration still includes a lead frame, thereby increases the on-resistance of the chip.

SUMMARY OF THE INVENTION

An object of present invention is to provide a method of mounting flip-chip-for lowering the on-resistance of power transistor in the protection circuit of rechargeable battery. It is therefore possible to use the flip-chip technology by directly welding a bare chip onto a circuit board to omit the resistance of connection-lead pin in conventional power transistor packing process, and to lower the on-resistance by about 20% to 30%.

Another object of present invention is to reduce the volume of battery protection circuit and correspondingly reduce the volume of a rechargeable battery by welding a bare chip directly onto a printed circuit board (PCB) to save packing volume by containing no lead frame and lead.

Therefore, further object of present invention is to reduce the cost by directly welding a bare chip onto a printed circuit board to save lined packing process.

It is therefore still another object of present invention to get a good heat dissipation effect by welding a bare chip directly onto a printed circuit board to have the surface of chip covered with metal contact of serially connected drain electrode (D end).

To achieve above and other object of present invention, a method of mounting flip-chip comprises the following steps: first, serially connect drain metal contacts of two transistors to form a chip cell during fabrication of wafer; then, use welding torch to point weld the metal wire on contact of each chip cell, so that the source and gate contacts will form welding metal bumps respectively; cut the wafer to form bare chip cells of two serially connected gate electrodes; stain said chip cell with tin, so that said welding metal bumps on contacts are attached with tin balls; apply plastic material to positioned points of printed circuit board; use flip-chip technology to make drain of a bare-chip cell face upward, so that tin balls of corresponding gate are oppositely arranged with respect to the contacts on output ends of logic circuit on the printed circuit board, and tin balls of corresponding sources are oppositely arranged with respect to the contacts on plus and minus poles of a battery; finally, passing through an oven for heating and pressuring, so that said tin balls will fuse and above oppositely arranged electrodes will form into electric connection.

BRIEF DESCRIPTION OF DRAWINGS

The above and other objects, features, and advantages of present invention will become more apparent from the detailed description in conjunction with the following drawings:

FIG. 2b is a schematic plan view of FIG. 2a.

FIG. 4b is a schematic plan view of FIG. 4a.

DETAILED DESCRIPTION OF THE INVENTION

First, the invention involves a vertically arranged metal-oxide-semiconductor field effect transistor (MOSFET), which is a power transistor arranged such that having its drain (Drain) on the lower side and its source (Source) and gate (Gate) on the upper side. The application of such MOSFET on the protection circuit of a rechargeable battery is described below, a touch welding attachment technique of flip-chip without connecting lead pin to lower the on-resistance.

Figure 2A:
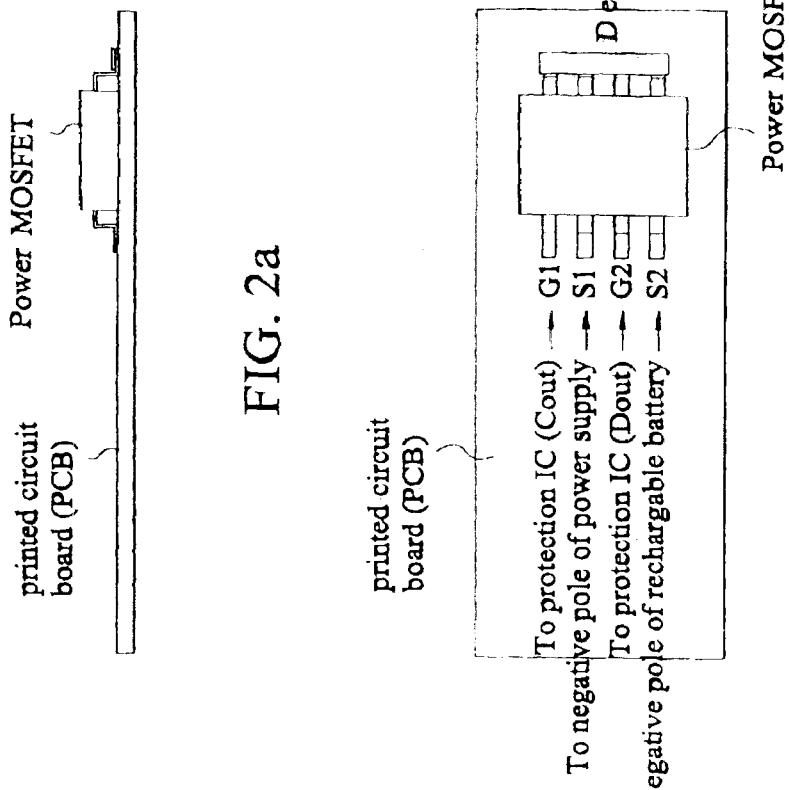
FIG. 2a is a schematic side view of a conventional power field effect transistor welded on the protection circuit of a circuit board.
Figure 2B:
Figure 1:
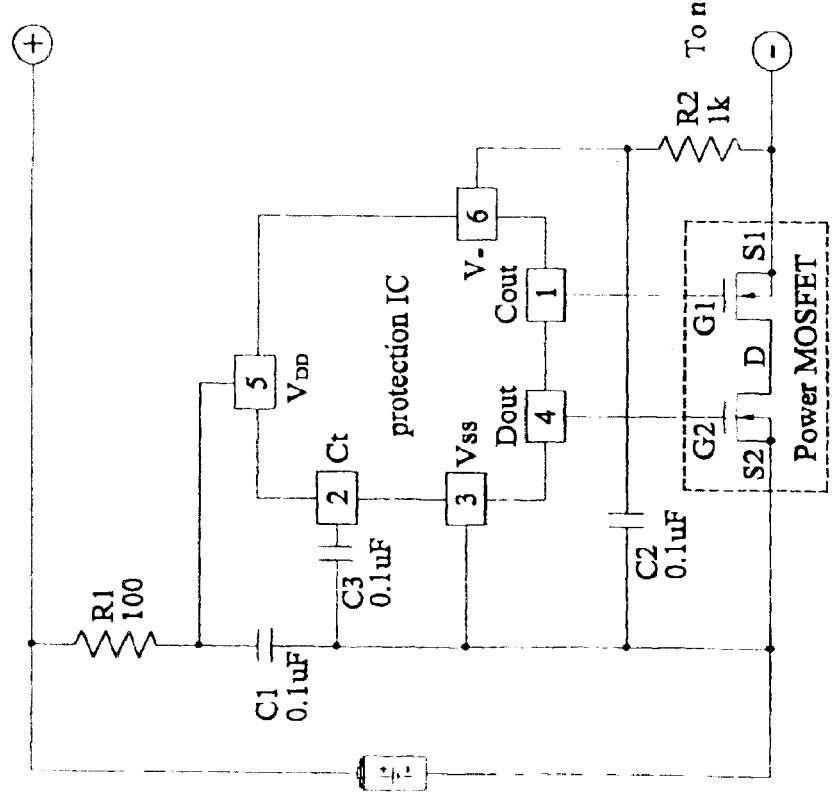
FIG. 1 is a schematic view of a conventional protection circuit of rechargeable battery.
Figure 3:
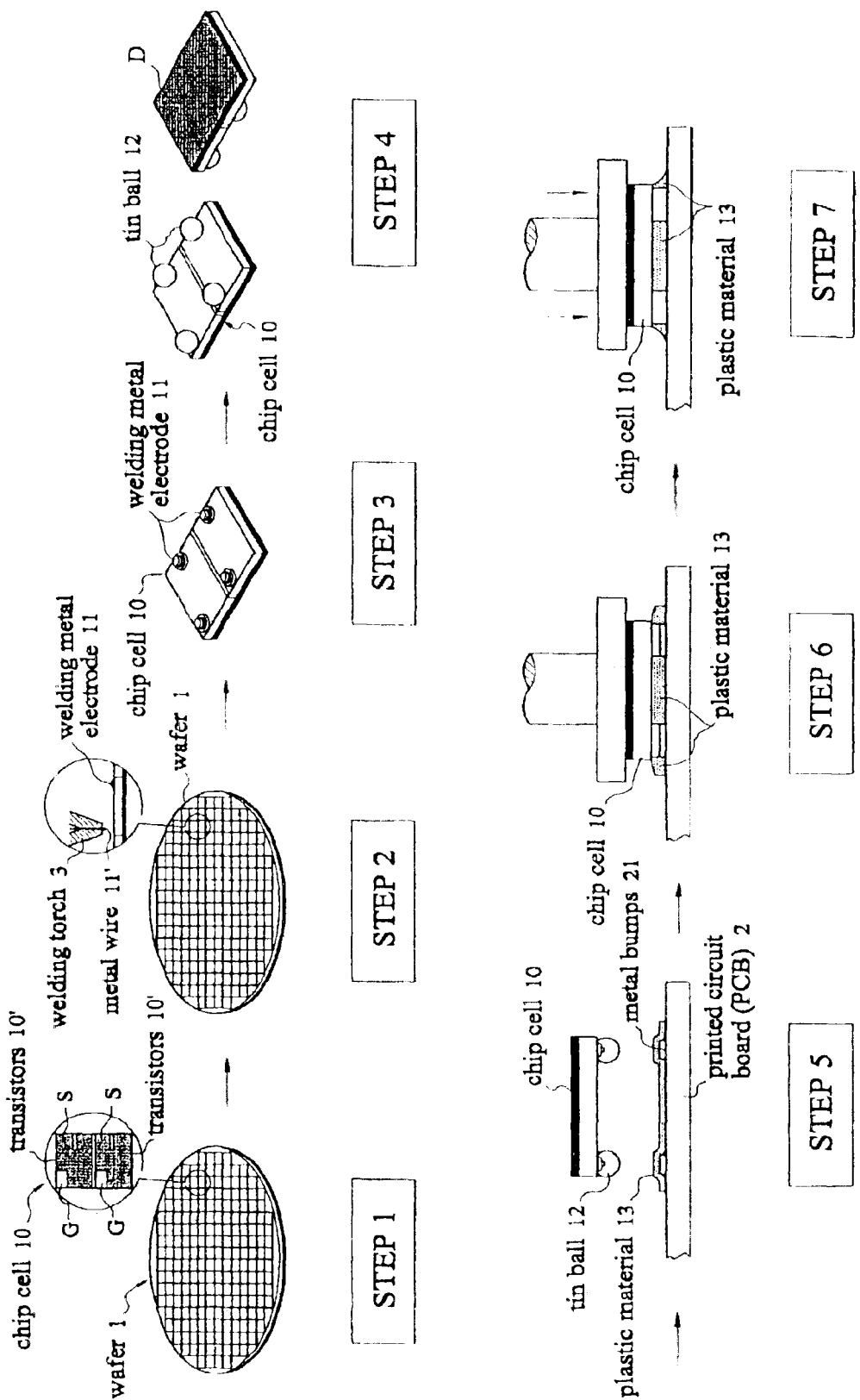
FIG. 3 is a schematic view of processes in the method of mounting flip-chip according to present invention.
Figure 4A:
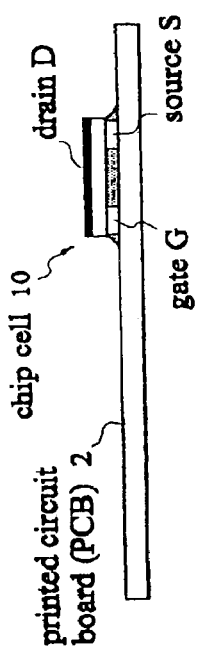
FIG. 4a is a schematic side view of a method of mounting flip-chip according to present invention, showing the power field effect transistor after the completion of assembling onto the protection circuit of a circuit board.
Figure 4B:
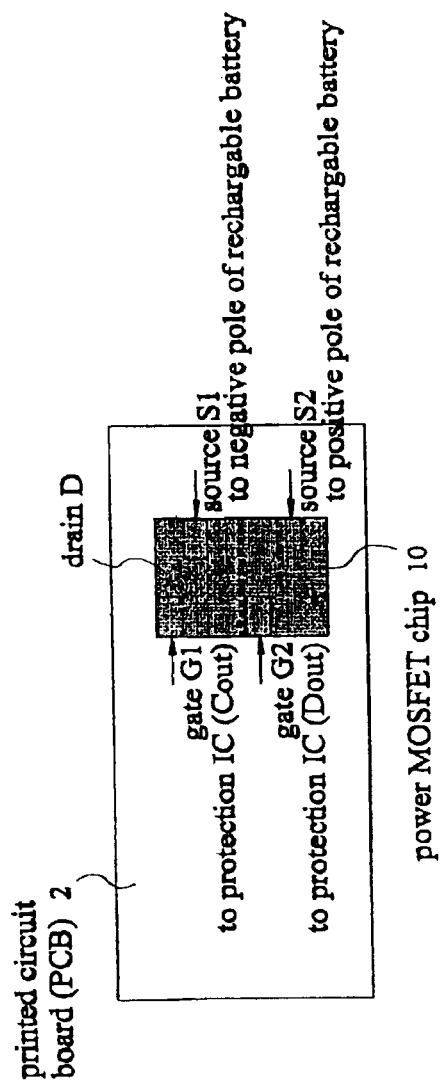

Next, referred to FIG. 3, a method of mounting flip-chip for lowering the on-resistance of power transistor in the protection circuit of rechargeable battery comprises the following steps:

Step 1: Serially connect the drain D metal contacts of two transistors 10' to form a chip cell 10 during fabrication of a vertically arranged wafer 1.

Step 2: Use welding torch 3 to spot-weld the metal wire 11' on contact of each chip cell 10, so that the source and gate contacts will form welding metal electrode 11 bumps respectively.

Step 3: Cut the wafer 1 to form bare chip cells 10 of two serially connected gate electrodes;

Step 4: Stain said chip cell 10 with tin so that said welding metal electrode 11 bumps on contacts are attached with tin balls 12.

Step 5: Apply plastic material 13 to positioned points of printed circuit board 2.

Step 6: Use flip-chip technology to make drain D of a bare chip cell 10 face upward, so that tin balls 12 of corresponding gate G are oppositely arranged with respect to the metal bumps 21 on output ends of logic circuit on the printed circuit board 2, and tin balls 12 of corresponding sources S are oppositely arranged with respect to the metal bumps 21 on positive and negative poles of a battery, respectively.

Step 7: Passing through an oven for heating and pressuring, so that said tin balls 12 will fuse and solder together with contacts on the printed circuit board, said plastic material 13 will fill up gaps between chip cell 10 and printed circuit board 2 and complete the fabrication.

Here, it is desirable to make a supplement description that steps 5, 6, and 7 which are processes of filling plastic such as ESC (Epoxy encapsulated solder connection) that first point-wise apply plastic material (thermal hardening resin) to substrate and then mount the chip. Since the difference between the coefficient of thermal expansion (CTE) of the organic substrate (about 14–17 ppm/oC) and the CTE of silicon substrate (about 4 ppm/oC) is too large, the stress induced by the incompatible CTE in thermal-expansion/cold-shrinkage can easily cause damage on contacts. Therefore, for the reliability consideration, it is usually necessary to fill plastic material in gaps between substrate and chip so as to disperse the stress and reduce stress on contacts.

With the method of mounting flip-chip according to present invention, it is possible to obtain the following effects:

(1) By directly soldering a bare chip onto a circuit board to omit the resistance of connection lead pin in conventional power transistor packing process, and to lower the on-resistance by about 20% to 30%.

(2) By directly soldering a bare chip onto a printed circuit board to save packing volume by containing no lead frame and lead.

(3) By directly soldering a bare chip onto a printed circuit board to omit wire bending packing process.

(4) By directly soldering a bare chip onto a printed circuit board to have the surface of chip covered with metal contact of serially connected drain electrode (D end).

Above described are preferred embodiments of the invention but not intended to be the limit of the invention, various revision and modification without departing from the claim must be considered within the scope of the invention.

To summarize, with the method of mounting flip-chip for lowering the on-resistance of power transistor in the protection circuit of rechargeable battery in present invention, it is not only possible to lower the on-resistance of a power field effect transistor, reduce the volume of its protection circuit, and correspondingly reduce the volume of a rechargeable battery, but also possible to save packing expense and reduce its manufacturing cost. Therefore, it is a novel, advanced invention with great industrial feasibility.

| LIST OF REFERENCE NUMERALS | |
|---|---|
| numeral | elements |
| 1 | wafer |
| 2 | printed circuit board (PCB) |
| 3 | welding torch |
| 10 | chip cell (power MOSFET chip) |
| 10' | transistor |
| 11 | welding metal electrode |
| 11' | metal wire |
| 12 | tin ball |
| 13 | plastic material |
| 21 | metal bump |
| D | drain |
| G | gate |
| S | source |

Step 1: Serially connect the drain metal contacts of two transistors to form a chip cell during fabrication of a vertically arranged wafer.

Step 2: Use welding torch to spot-weld the metal wire on contact of each chip cell, so that the source and gate contacts will form welding metal electrode bumps respectively.

Step 3: Cut the wafer to form bare chip cells of two serially connected gate electrodes;

Step 4: Stain said chip cell with tin so that said welding metal electrode bumps on contacts are attached with tin balls.

Step 5: Apply plastic material to positioned points of printed circuit board (PCB).

Step 6: Use flip-chip technology to make drain of a bare chip cell face upward and amount tin balls and correspondingly fix them to the metal contact bumps on the printed circuit board (PCB).

Step 7: Passing through an oven for heating and pressuring, so that said tin balls will fuse and solder together with metal contacts on the printed circuit board (PCB) and complete the fabrication.

What is claimed is:

1. A rechargeable battery arrangement, the arrangement comprising a rechargeable battery and a protection circuit therefor, the rechargeable battery arrangement formed by the steps comprising:

mounting a field effect transistor arrangement on a circuit board, by (a) forming a chip cell comprising two transistors in which the drains of the respective transistors are serially connected; (b) forming gate and source electrodes, on the side of the chip cell opposite the drains, on the respective gate and source contacts of the respective field effect transistors; (c) adhering tin balls to each respective gate and source electrode bumps of each respective field effect transistor; (d) applying a plastic material to the top surface of at least a portion of the circuit board under which the chip cell will be positioned; (e) positioning the chip cell relative to the printed circuit board so that the source and drain electrode bumps of the respective field effect transistors are in facing alignment with the top surface of the circuit board; and (t) electrically adhering the respective tin balls to respective contacts on the printed circuit board and causing the plastic material to fill any existing air gaps located between the chip cell and the printed circuit board; and electrically coupling (a) the gate electrode of the first field effect transistor to an output of the protection circuit, (b) the gate electrode of the second field effect transistor to another output of the protection circuit, and (c) the source electrode of the first field effect transistor to a negative terminal of the rechargeable battery; and wherein the source electrode of the second field effect transistor is electrically couipleable to a positive terminal of a power supply for recharging the rechargeable battery.

* * * * *